US008400176B2

(12) United States Patent
Arkin et al.

(10) Patent No.: US 8,400,176 B2
(45) Date of Patent: Mar. 19, 2013

(54) WAFER LEVEL CONTACTOR

(75) Inventors: Brian J. Arkin, Pleasanton, CA (US); Alistair Nicholas Sporck, Saratoga, CA (US)

(73) Assignee: FormFactor, Inc., Livermore, CA (US)

( * ) Notice: Subject to any disclaimer, the term of this patent is extended or adjusted under 35 U.S.C. 154(b) by 129 days.

(21) Appl. No.: 12/543,386

(22) Filed: Aug. 18, 2009

(65) Prior Publication Data

US 2011/0043233 A1 Feb. 24, 2011

(51) Int. Cl.
*G01R 31/00* (2006.01)

(52) U.S. Cl. ......... 324/756.03; 324/756.05; 324/755.03; 324/754.07; 324/750.3

(58) Field of Classification Search ............. 324/754.07, 324/756.03, 756.05, 755.03, 750.3
See application file for complete search history.

(56) References Cited

U.S. PATENT DOCUMENTS 5,363,038 A 11/1994 Love
5,434,513 A 7/1995 Fujii et al.
5,497,079 A 3/1996 Yamamda et al.
5,532,610 A 7/1996 Tsujide et al.
5,600,257 A 2/1997 Leas et al.
6,064,213 A 5/2000 Khandros et al.
6,184,053 B1 2/2001 Eldridge et al.
6,246,250 B1 * 6/2001 Doherty et al. .......... 324/754.07
6,275,051 B1 8/2001 Bachelder et al.
6,275,055 B1 * 8/2001 Hyozo et al. ............... 324/750.3
6,400,173 B1 6/2002 Shimizu et al.
6,678,850 B2 * 1/2004 Roy et al. ...................... 714/730
6,724,209 B1 * 4/2004 Whitten et al. ............ 324/750.3
6,856,150 B2 2/2005 Sporck et al.
6,922,320 B2 * 7/2005 Ochi ........................... 361/93.1
7,245,134 B2 7/2007 Granicher et al.
7,388,424 B2 6/2008 Miller
2005/0237073 A1 10/2005 Miller et al.
2006/0217906 A1 * 9/2006 Barbara et al. ................. 702/60
2006/0250150 A1 11/2006 Tunaboylu et al.
2006/0273809 A1 12/2006 Miller et al.
2007/0200571 A1 * 8/2007 Quinn et al. ................. 324/754
2008/0054917 A1 3/2008 Hensen et al.
2008/0100320 A1 5/2008 Miller et al.
2009/0079448 A1 3/2009 Berry
2009/0085590 A1 4/2009 Berry
2009/0164931 A1 6/2009 Kemmerling

FOREIGN PATENT DOCUMENTS

JP 08-037215 2/1996
JP 08-129053 5/1996

OTHER PUBLICATIONS

John Darling, "A Comparison of Wafer Level Burn-in and Test Platforms for Device Qualification and Known Good Die (KGD) Production", Jun. 2003, Delta V Instruments.
U.S. Appl. No. 12/239,326, filed Sep. 26, 2008, Kemmerling.
U.S. Appl. No. 12/046,009, filed Mar. 11, 2008, Kemmerling.
U.S. Appl. No. 12/044,600, filed Mar. 7, 2009, Kmmerling.
PCT Application No. PCT/US2010/045441, International Search Report and Written Opinion, 10 pages (Apr. 22, 2011).
PCT Application No. PCT/US2010/045441, International Preliminary Report on Patentability, 6 pages (Mar. 1, 2012).

* cited by examiner

*Primary Examiner* — Arleen M Vazquez
(74) *Attorney, Agent, or Firm* — Kirton McConkie

(57) ABSTRACT

A probe card assembly can include a plurality of probes disposed on a substrate and arranged to contact terminals of a semiconductor wafer. Switches can be disposed on the probe card assembly and provide for selective connection and disconnection of the probes from electrical interconnections on the probe card assembly.

20 Claims, 5 Drawing Sheets

WAFER LEVEL CONTACTOR

CROSS REFERENCE TO RELATED APPLICATIONS

None

BACKGROUND

Manufacturing of semiconductor devices typically includes making a large number of semiconductor devices on a wafer. During the manufacturing process, the semiconductor devices can be separated from each other in a process called singulation. For example, the wafer can be sawed up to separate the semiconductor devices from each other. The singulated semiconductor devices can then be incorporated into other electronic devices and/or packaged.

For various reasons, fabricated semiconductor devices sometimes fail to perform correctly. Accordingly, at various points in the manufacturing process, tests of the semiconductor devices are typically performed to enable identification of defective devices. Defective devices can then be discarded, or in some cases, repaired. Types of tests performed can include functional tests, speed tests and sorting, and burn-in testing. Burn-in testing is typically performed at elevated temperatures.

Testing can be performed both before and after a wafer has been singulated into individual semiconductor devices. Typically, much of the testing has been performed after a wafer is singulated, as testing at the wafer level has presented a number of challenged. For example, burn-in testing is typically performed on semiconductor devices that have been singulated and packaged. When a semiconductor device is found to be defective after being packaged, the expense of packaging the device is therefore wasted.

SUMMARY

In some embodiments, a probe card assembly can include a plurality of probes arranged to contact ones of the input/output terminals of semiconductor devices disposed on a wafer. A plurality of switches disposed on the probe card assembly can interconnect ones of the probes to electrical interconnects, wherein the electrical interconnections can include an electrical bus. A means for controlling the switches can enable the probes corresponding to terminals of a failed one of the plurality of semiconductor devices to be disconnected from the electrical interconnections.

In some embodiments, a probe card assembly can include a tester interface, a bus electrically coupled to the tester interface, and a probe. A slew rate converter can be coupled to the bus and the probe and configured to modify the slew rate of an electric signal passing between the bus and a probe.

In some embodiments, a probe card assembly can include a plurality of probes arranged to contact ones of the input/output terminals of semiconductor devices disposed on a wafer. A continuity tester and a plurality of switches can also be included. The switches can allow the continuity tester to be electrically connected to a selected one of the plurality of probes.

DETAILED DESCRIPTION OF EXEMPLARY EMBODIMENTS

Figure 1:
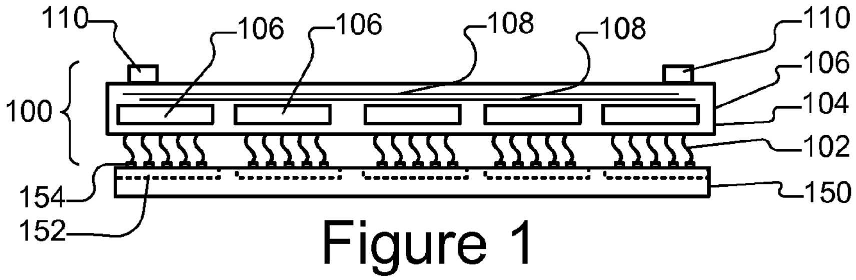
FIG. 1 is an illustration of a probe card assembly in contact with a wafer according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As alluded to above, performing testing at a wafer level can be challenging, especially when there are a large number (e.g., hundreds or thousands) of semiconductor devices on a wafer. Testing these devices typically involves making electrical connections between the terminals of the semiconductor devices and test circuitry. Electrical connections can be made by a probe card assembly. Test signals can be fed to the semiconductor devices under test (DUTs) and response signals can be monitored to determine if the DUTs are operating correctly. Test signals can be generated by test circuitry disposed on the probe card assembly or provided by a tester connected to the probe card assembly.

When performing wafer level testing, a very large number of input and output signals to the DUTs may potentially be needed. It can be difficult accommodate a large number of input output signals, due to limits in tester capacity and cost impacts on the probe card. For example, to accommodate a large number of input and output signals through the probe card can involve expensive multilayer controlled impedance board designs for the wafer-level probe card assembly. While such wafer-level probe card assemblies have been used for some kinds of testing, it has not been economical to perform some tests at a wafer level. For example, burn-in testing typically takes many hours to perform. Accordingly, it is undesirable to tie up an expensive wafer-level probe card assembly for burn in testing.

One approach to reducing the cost of a wafer-level probe card assembly is to provide electrical connections to only some of the semiconductor devices on the wafer. Use of such a reduced-interconnection probe card assembly however increases test time, as the wafer must be repositioned and contacted ("touchdowns") several times by the probe card assembly to completely test the wafer. This is a considerable disadvantage when performing burn-in test, as the test time is directly multiplied by the number of touchdowns required.

Accordingly, a wafer-level probe card assembly has been invented which, among other uses, can provide benefits in performing wafer level burn-in testing. FIG. 1 provides a schematic depiction of a probe card assembly in accordance with some embodiments of the invention. The probe card assembly, shown generally at 100, can be used for testing a plurality of semiconductor devices 152 disposed on a wafer 150. The semiconductor devices 152 can each include a plurality of input/output terminals 154. Input/output terminals can be, for example, bond pads, contact elements (e.g., resilient spring contacts). The input/output terminals can correspond to signal and power inputs and outputs for the semiconductor devices, and can be used during normal operation of the semiconductor devices or special input/output terminals used only during testing.

The probe card assembly 100 can include a plurality of probes 102 arranged to contact ones of the input/output terminals. In other words, the spatial arrangement of the probes can correspond to the spatial arrangement of the input/output terminals. Accordingly, when the probe card assembly 100 and wafer 150 are brought together, the probes 102 make contact with corresponding ones of the terminals 154. The probes 102 can be disposed on one or more substrates 104 as described in further detail below. The substrate can be rigid. For example, a rigid substrate can comprise a ceramic material. As another example, a semi-rigid substrate comprising an organic material can be coupled to a stiffener comprising a metallic material. Various types of probes can be used, including for example, spring contact probes (e.g., cantilevered beams), needle probes, membrane probes, and the like.

The probe card assembly 100 can be installed into a prober (not shown) or other equipment (not shown). Accordingly, the probe card assembly can be configured to mechanically interface to a prober. Various ways of mechanically interfacing a probe card assembly to a prober can be used. For example, the probe card assembly can interface to a head plate, insert ring, or other element of the prober.

The probe card assembly 100 can also include an electrical interface 110 to a test head (not shown) or tester (not shown). For example, the electrical interface can be provided by a variety of means including zero insertion force connectors, pogo pins, and the like. The electrical interface 110 can be mounted to or otherwise supported by the substrate 104. The electrical interface can provide electrical connection to allow power to be supplied to the probe card assembly 100. The electrical interface 110 can also provide for transmission and reception of test and response signals between the probe card assembly 100 and the tester, and for transmission and reception of control and status signals between the probe card assembly and the tester. The tester can therefore be used to power the DUTs, generate signals used to test the DUTs, to monitor responses from the DUTs, and to control the probe card assembly 100.

Disposed on the probe card assembly 100 can also be a plurality of test devices 106. The test devices can be active integrated circuits and can comprise test circuitry, various examples of which are described further below. The test devices can be, for example, semiconductor devices, daughter cards, multi-die modules, and the like. Interconnections 108 can be included on the probe card assembly 100 to interconnect the probes 102, test devices 106, and electrical interface 110.

Figure 2:
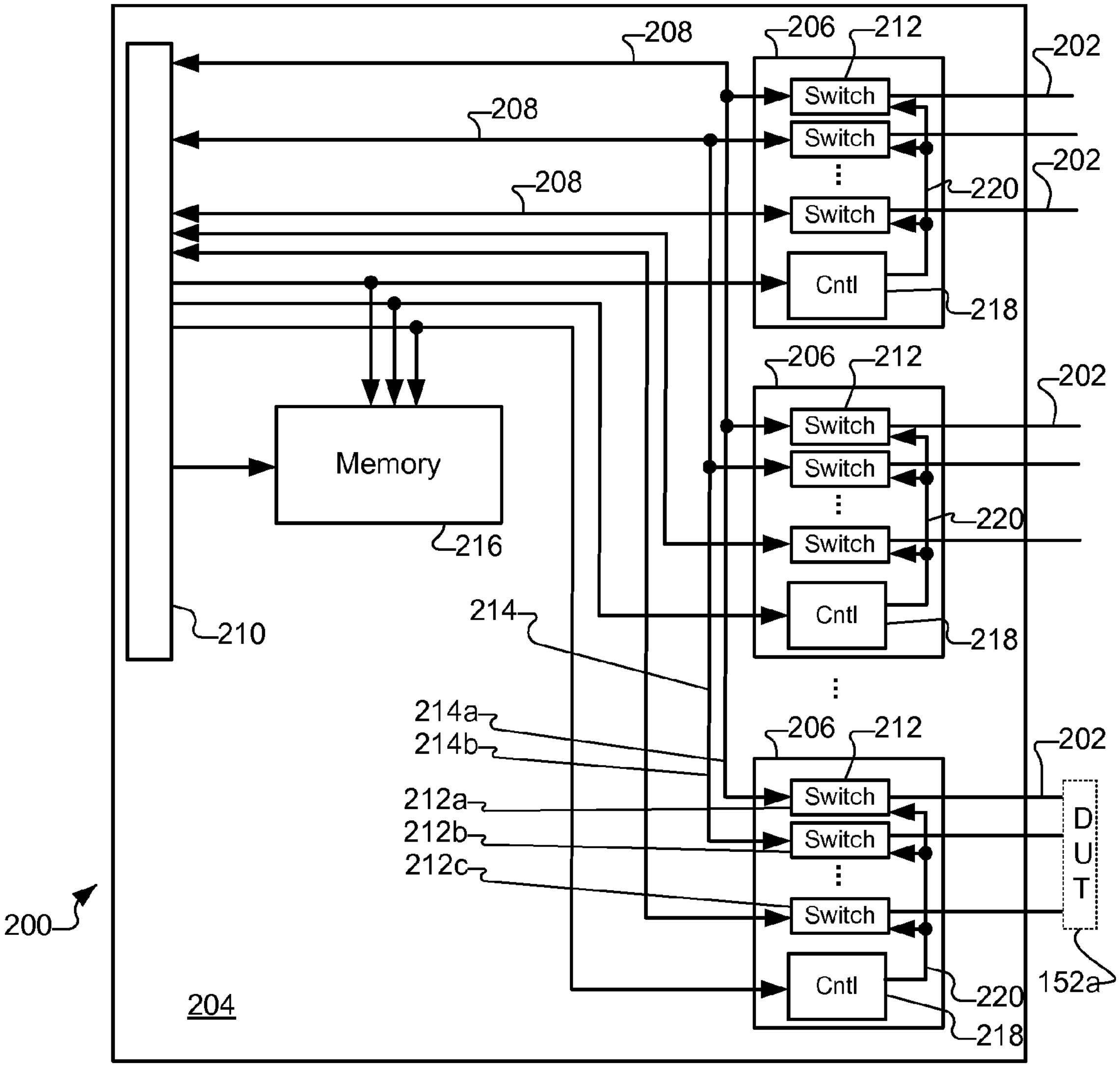
FIG. 2 is a schematic of a probe card assembly according to some embodiments of the invention.

FIG. 2 illustrates a schematic diagram of a probe card assembly 200 in accordance with some embodiments of the present invention wherein test devices 206 on the probe card assembly comprises switches 212 allowing for selective interconnection of probes 202 to electrical interconnections 208 on the probe card. Probes 202 can be like probes 102 described above and probe card assembly 200 can be used for testing a wafer 150. Components of the probe card assembly can be mounted, attached, or otherwise disposed on a substrate 204. Substrate 204 can be like substrate 104, and the probe card assembly can include one or more substrates. Probes 204 can be attached to a plurality of probe substrates, and the plurality of probe substrates can be attached or otherwise coupled to a main substrate, for example, as described further below. The test devices 206 can be mounted on the main substrate, or mounted on daughter substrates, and the daughter substrates can be attached or otherwise coupled to the main substrate.

One or more of the electrical interconnections 208 can be, for example, a bus 214. Busses can be used for power distribution, signal distribution, and the like. Busses can be used to reduce the number of connections between the semiconductor devices 152 and test circuitry used to generator/monitor test signals. For example, for memory semiconductor devices, busses can be provided for some control signals (e.g., read/write signals), data lines, addresses lines, and power lines. As a particular example, data lines can be bussed together for the memory devices, and common address lines and individual chip select signals used to select one or more memory devices for reading and writing data.

One challenge that can be presented in performing wafer level burn-in is the presence of failed semiconductor devices on the wafer. In performing burn-in of packaged semiconductor devices, it is possible to screen out failed semiconductor devices by testing the semiconductor devices prior to burn-in. In contrast, on a wafer, there may be one or more failed semiconductor devices. A failed semiconductor device can cause the entire bus to fail. The location or position of the failed semiconductor devices can be different from wafer to wafer, and thus it is difficult to isolate failed semiconductor devices. With larger wafers, the likelihood that there is at least one failed semiconductor device on a wafer is significant, and thus such a situation would be unworkable.

Switches 212 between the probes 202 and the electrical busses 214 can be used to disconnect failed ones of the semiconductor devices (e.g., 152*a*) from the electrical interconnections 208. For example, burn-in testing can include determining failed ones of the semiconductor devices 152, and then opening ones of the switches 206 to isolate failed ones of the semiconductor devices from the electrical interconnections 208.

As a particular example, the electrical interconnections 208 can include a first electrical bus 214*a* and a second electrical bus 214*b*. A failed DUT can be detected by detecting an input/output signal error on the first electrical bus. When the failed DUT (e.g., 152*a*) is detected, switches (e.g., switches 212*a*, 212*b*) corresponding to terminals of the DUT connected to each of the first electrical bus 214*a* and the second electrical bus 214*b* can be opened, thereby disconnecting the DUT from the busses. For example, a failed DUT can be disconnected from power and signal busses.

Sufficient switches 212 can be provided on the probe card assembly so that a failed semiconductor device can be entirely disconnected. Thus, other switches (e.g., switch 212*c*) corresponding to other terminals of the semiconductor device can also be opened, so that all of the probes 202 connected to the failed semiconductor device 152*a* are completely disconnected from the electrical interconnections 208. In other words, every input/output terminal of the failed semiconductor device can be electrically disconnected. This can include bussed signals, non-bussed signals, power signals, etc. Completely disconnecting a failed device can be beneficial for several reasons. First, when a semiconductor device has failed, any remaining connected inputs and outputs from that device can potentially cause other devices to fail or appear failed (e.g., by causing short circuits or overloading busses). Further, by disconnecting a failed semiconductor device, overall power consumption during testing can be reduced (e.g., power drawn from a tester or power supply). Further, by providing switches to completely disconnect the input/output terminals, complex resistor networks can be avoided, simplifying the overall design of the probe card assembly.

The switches 206 can be controlled by the control circuit 218 or directly by the tester through the electrical interface 210, for example, through control lines 220. The control circuit 218 can also control other functions on the test device 206. The control circuit 218 can be connected to the electrical interface 210 to provide a control interface allow communications with a tester or other equipment that controls operation of the probe card assembly. Although individual connections are shown here between each test device 206 and the electrical interface 210, this is not essential. For example, a control interface can be bussed or daisy-chained between the test devices to reduce the number of interconnections (e.g., using addressing of individual test devices). The control interface can use parallel data, serial data, or combinations thereof.

The switches 206 can be any of several different components types. For example, the switches can be electromechanical relays or solid-state switches. Various types of solid-state switches can be used, including for example, transistors, thyristors, optically-coupled transistors (e.g., photo coupled metal oxide semiconductor field effect transistors) and the like. It is not necessary for all of the switches to be the same type. For example, a first type of switch (e.g., electromechanical relays) can be used on high current lines (e.g., power lines) and a second type of switch (e.g., transistors) can be used on lower current lines (e.g., signal lines). The switches can be powered from different voltage levels that provided to the semiconductor devices. For example, an active switch can be powered from a supply that allows passing signals that exceed the normal voltage limits for the device under test (e.g., a signal voltage lower than ground or a signal voltage higher than the positive supply rail provided to the semiconductor device). This can be helpful for continuity testing, for example, as described further below.

Various ways of determining the failed ones of the semiconductor devices can be used. For example, failed ones of the semiconductor devices can be determined by testing the semiconductor devices. Testing can be performed by providing test signals to the semiconductor devices through the probes and checking response signals received from the semiconductor devices through the probes. The test signals can be generated by the probe card assembly (e.g., using test circuitry (not shown) disposed on the probe card assembly), or test signals can be generated by a tester and provided through the electrical interface 210 to the probe card assembly (electrical interface 210 can be similar to electrical interface 110). Information regarding failed devices can be reported to the probe card assembly through the tester interface. Accordingly, the test circuitry and the tester interface each provide an example of means for determining a failed one of the semiconductor devices.

As another example, a map of known bad ones of the devices can be provided to the probe card assembly. For example, wafer level testing can be performed and a wafer map of known bad ones of the devices produced. The testing can be performed using the probe card assembly, or can be performed using a different test station comprising a different probe card assembly. The map of known bad ones of the devices can be accepted by the probe card assembly, for example, through the electrical interface 210. If desired, the probe card assembly can include a memory 216 for storing the map of known bad ones of the devices. Accordingly, accepting a map of known bad ones of the devices provides another example of a means for determining a failed one of the devices. Alternatively, or in addition, the memory can be used to store fault information identifying semiconductor devices which are detected as failed by the probe card assembly (e.g., through functional tests, overcurrent, etc.). The electrical interface 210 can include a communications interface to allow exchanging of fault information and/or wafer maps between the probe card assembly and a tester.

A failed semiconductor device can be detected in various ways. For example, a failed semiconductor device can be detected during testing due to errors on response signals (e.g., stuck at zero, stuck at one, or terminals that are shorted together) by test circuitry disposed on the probe card or the tester. As another example, a failed semiconductor device can be detected due to excessive power drain on a terminal (e.g., a shorted power terminal) or by lack of continuity (e.g., an open circuit). Accordingly, the test devices 206 on the probe card assembly can, if desired, include test circuitry to detect open and short circuits.

Figure 3:
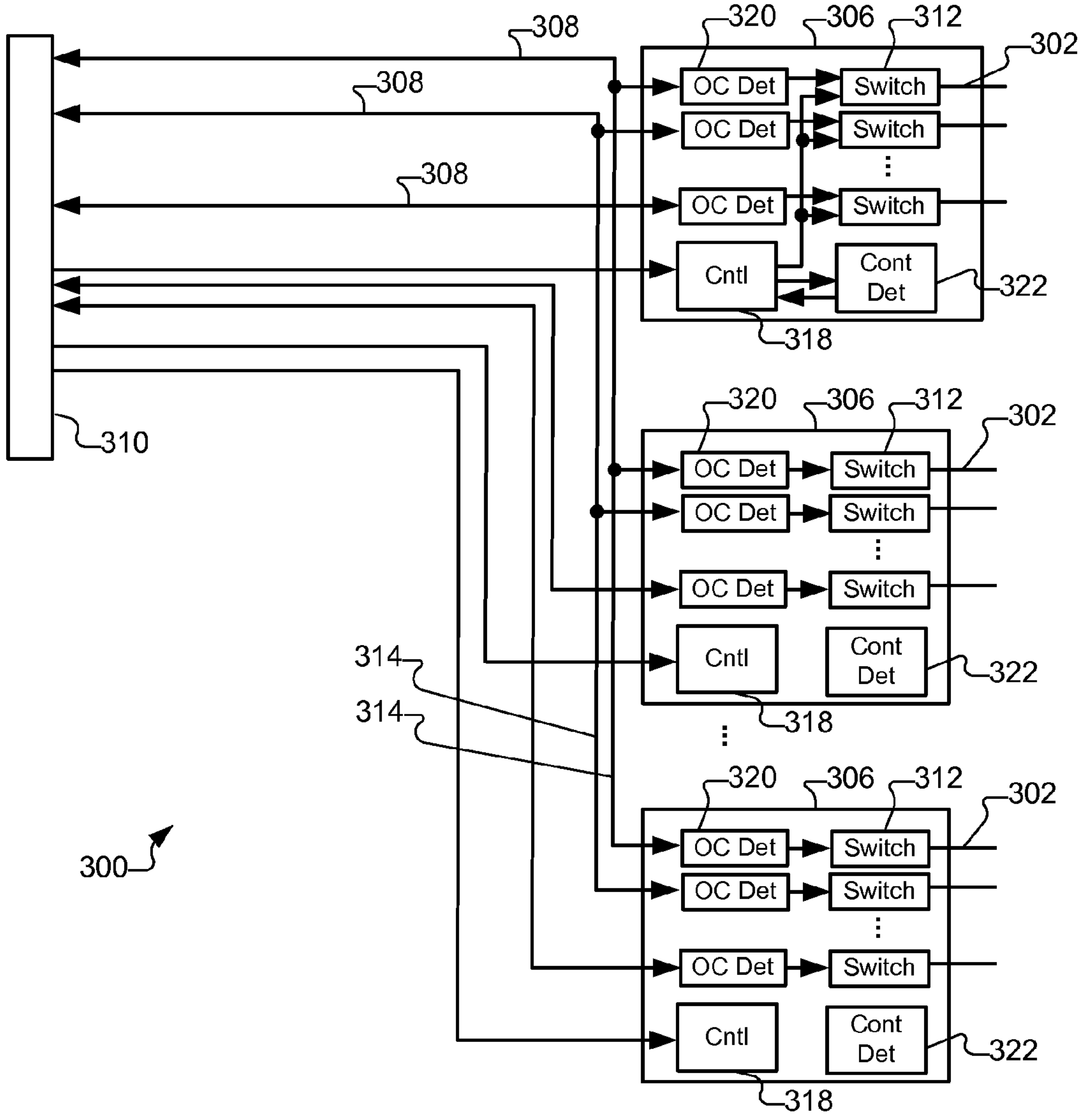
FIG. 3 is an electrical schematic of an alternate arrangement of a probe card assembly according to some embodiments of the invention.

For example, FIG. 3 is an electrical schematic diagram of a probe card assembly 300 in accordance with some embodiments of the present invention that includes overcurrent detectors 320 and a continuity detector 322. The continuity detector is an example of a continuity tester. The probe card assembly 300 can include features generally similar to probe card assembly 200 (e.g., probes 302, electrical interconnections 308, electrical interface 310, switches 312, and busses 314 can be similar to probes 202, electrical interconnections 208, electrical interface 210, switches 212, and busses 214). The probe card assembly 300 can be mechanically arranged similarly to probe card assembly 200 (e.g., probe card assembly 300 can include one or more substrates on which components such as probes 302, test devices 306, electrical interface 310, etc. are disposed). The probe card assembly 300 can, if desired, include a memory (e.g., like memory 216 described above) for storing a map of failed devices and fault information.

The test devices 306 can include overcurrent detectors 320 associated with some or all of the switches 312. The overcurrent detectors 320 can detect when excessive current is being drawn, and cause the associated switch 312 to open. In addition, when excessive current is detected on one terminal of a failed semiconductor device, switches corresponding to all of the terminals of the failed semiconductor device can be opened to completely disconnect the failed semiconductor device. For example, control of the switches can be coordinated with the overcurrent detectors through the control circuit 318.

One or more continuity detectors 322 can also be included on the probe card assembly. For example, each test device 306 can include a continuity detector (as shown), or one continuity detector can be provided on the probe card assembly and selectively connected to each of the busses. Accordingly, if desired, a continuity check can be performed by successively connecting the continuity detector 322 to each probe 302 (e.g., through switches 312 under control of control circuit 318) and verifying that the probe is in contact with the corresponding terminal. The continuity detector can operate by providing a sufficient voltage and current to forward bias a protective diode included in input circuitry of the semiconductor device. When an open circuit is present (e.g., due to a failed semiconductor device or a lack of contact between a probe and the corresponding terminal), little or no current will flow. Accordingly, detection of an open circuit (due to either a failed semiconductor device or a lack of electrical contact between a probe and corresponding terminal) can be obtained.

To provide a sufficient voltage to forward bias a protective diode of the semiconductor device, the continuity detector 322 can be provided a voltage supply that exceeds that provided to the semiconductor device as alluded to above. For example, the continuity detector can be provided supplies that allow for generating a voltage about 0.6 volts below ground (or alternatively, about 0.6 volts above the positive supply rail) to provide a forward bias voltage on a protective diode within the semiconductor device. Supply voltages for the continuity detector can be developed on the probe card assembly, for example, using techniques described further below.

As an alternative to including the continuity detector 322 on the probe card, a tester can be used to provide continuity testing by sourcing continuity test signals to the probe card. The switches 312 can be used to switch the continuity test signal from the tester to different probes as desired.

Continuity testing can help to reduce the incidence of erroneous test results (e.g., erroneously reporting a DUT as failed when there is instead an interconnection problem between the DUT and the probe card assembly). For example, a probe card assembly can be brought into contact with a wafer, and a continuity test performed for each probe that should be in contact with a corresponding terminal. If all connections are present, additional testing (e.g., burn-in testing) can be performed. If some connections are missing, adjustment of the probe card assembly relative to the wafer can be performed, and the continuity test repeated. For example, certain patterns of missing connections can indicate alignment problems between the probe card assembly and the wafer. Accordingly, when connections are missing, adjustments of the probe card assembly (e.g., automatic or manual), wafer (e.g., moving a stage on which the wafer rests), or both can be performed.

As a particular example, a wafer can be moved upward toward the probe card assembly until an initial contact is sensed. The wafer can then be moved closer to the probe card assembly (increasing pressure between the probes and the terminals) until continuity tests indicate a sufficient number of connections are present or some other predefined criteria (e.g., a maximum displacement, etc.) is reached.

The continuity detector 322 can also be used for performing self-test of the probe card assembly 300, for example to detect short circuits, open circuits, or both. Short circuits between probes 302, between electrical connections 308, and within the electrical interface 310 can be detected. For example, the continuity detector 322 can be connected to pairs of probes (e.g., through the switches 302 and under the control of the control circuit 318). Continuity can therefore indicate the presence of a short circuit. As a more particular example, for testing N probes, the continuity detector can be connected to apply a voltage to a first one of N probes, and the remaining N-1 probes can be connected to ground. If current flows, this can indicate a short circuit between two or more probes. If no current flows, the test can continue by applying a voltage to a second one of the N probes and grounding the remaining N-1 probes (or N-2, if desired, as the first one of the probes can be omitted since it has already been tested). The process can repeat until all N probes have been checked for short circuits relative to the other probes. Similar short circuit testing can be performed for the electrical interface, checking each line of the electrical interface.

To detect open circuits on the electrical interface 310, a shorting fixture can be used that connects all of the individual lines of the electrical interface to a common electrical path (e.g., a ground). Lack of continuity for an individual line to the common electrical path indicates an open circuit. To detect open circuits on the probes 302, a shorting wafer can be brought into contact with the probes, and continuity verified for each probe in a similar manner. Managing the self test can be performed by the control circuit 318, or by additional circuitry disposed on the probe card (not shown) such as a microprocessor or microcontroller. The probe card self-test can therefore be performed without use of external active electronics equipment. Self-test time can be decreased by performing multiple testing in parallel, for example, using more than one continuity detector.

While the probe card assembly 300 in shown as including both over current detectors 320 and continuity detectors 322, this is not essential. In some embodiments a probe card assembly can include one and not the other (e.g., over current detectors without continuity detectors or vice versa). Moreover, over current detectors 320 need not be provided to correspond to every probe 302, and can be provided for less than all of the probes 302.

Additional circuitry can also be included on the probe card that can be helpful in performing wafer level burn-in and other tests. For example, during burn-in testing, while functional testing of the semiconductor devices on the wafer can be performed, this testing need not be performed at the full operating speed of the semiconductor devices. Accordingly, reduced signal edge speeds can be used on the probe card assembly helping to further reduce cost of the probe card assembly.

Figure 4:
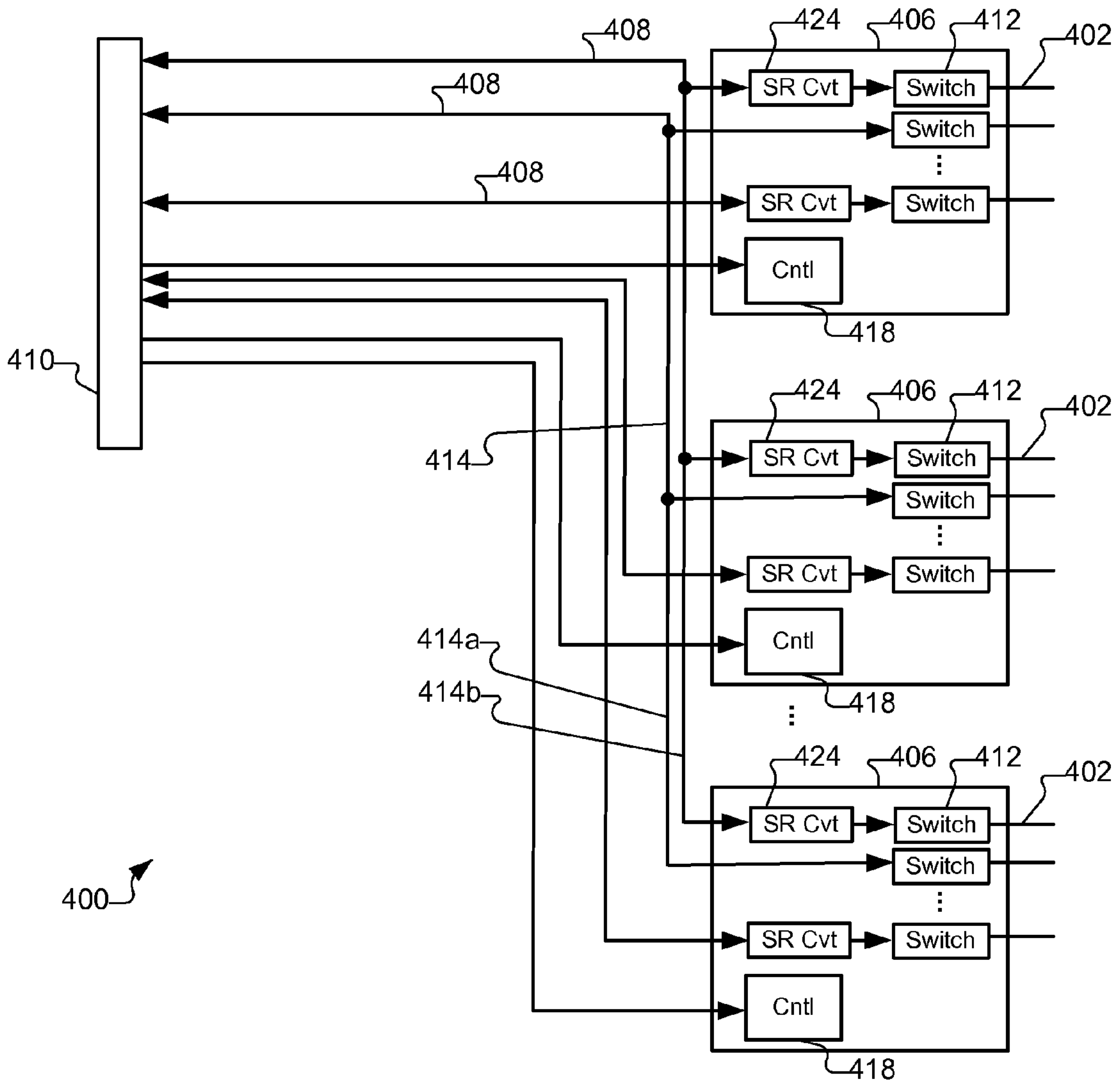
FIG. 4 is an electrical schematic of alternate arrangement of a probe card assembly according to some embodiments of the invention.

For example, FIG. 4 is a schematic diagram of a probe card assembly 400 in accordance with some embodiments of the present invention that includes slew rate converters 424 in test devices 406. The probe card assembly 400 can include features generally similar to probe card assemblies 200, 300 (e.g., probes 402, electrical interconnections 408, electrical interface 410, switches 412, busses 414, and control circuit 418 can be similar to probes 202, 302 electrical interconnections 208, 308 electrical interface 210, 310 switches 212, 312, busses 214, 314, and control circuit 218, 318). The probe card assembly 400 can be mechanically arranged similarly to probe card assemblies 200, 300 (e.g., probe card assembly 400 can include one or more substrates on which components such as probes 402, test devices 406, electrical interface 410, etc. are disposed). The probe card assembly 400 can, if desired, include a memory (e.g., like memory 216) to provide storage for a map of failed devices and/or fault information. The probe card assembly 400 can also include, if desired, overcurrent detectors, continuity detectors, or both, as described above.

Slew rate converters 424 can be included for signal lines (e.g., bus 414*b*) which provide input or output signals to signal terminals of the DUTs. For example, the slew rate converter can convert high-speed input output signals provided to/from a DUT into lower edge rate signals on the electrical interconnections 408. Slew rate converters are not needed for power lines (e.g., bus 414*a*) which provide power to power terminals of the DUTs.

The slew rate converters 424 can be configured to increase a slew rate of an electronic signal passing from the electrical interconnections 408 to probes 402 that provide input or output signals to the devices under test. In other words, a signal generated by the test circuitry on the probe card assembly or tester can have a low slew rate, which is increased by the slew rate converter before it is passed to a DUT via the connection between the probe and the terminal of the DUT. Conversely, the slew rate converters 424 can decrease a slew rate of an electronic signal passing from the probes 402 to the electrical interconnections 408. In other words, a high slew rate signal generated by the DUT can be received through the terminal and probe connection and converted to a low slew rate signal that is passed to the test circuitry on the tester or the probe card assembly. By using lower slew rate signals on a probe card assembly, reduced cross talk can be obtained, in turn allowing for less expensive circuit board layouts. For example, using lower slew rate signals can allow the use of special dielectric materials, impedance control, special vias, and signal planes to be avoided. Lower slew rate signals can be used during burn-in testing because such testing need not be performed at high speed. As a specific example, a DUT may be capable of operating at rates of several hundred megahertz or even at gigahertz rates. Signal transition rates during burn in test, however, need not be higher than a few hundred megahertz. Accordingly, slew rates provided by the DUT may be one or more orders of magnitude different from slew rates used on signals within the probe card assembly.

The slew rate converters can change a slew rate of signals by changing the rate of change in signal voltage versus time when a signal transitions (e.g., from a logic high level to a logic low level, or vice versa). For example, by slowing down the slew rate of a signal, high frequency components of the signal can be reduced, in turn helping to reduce the potential for interference (e.g., crosstalk) being generated by the signal.

Slew rate conversion can be performed without changing the steady state input and output voltages. For example, for a logic signal, the logic high and logic low voltage levels can be maintained. In such a case, when the slew rate is increased, a transition between logic levels can result in the new logic level being reached faster at the output than at the input of the slew rate converter. Conversely, when a slew rate is decreased, a transition between logic levels can result in the new logic level being reached more slowly at the output than the input of the slew rate converter.

If desired, in addition to slew rate conversion, voltage level conversion can also be included in the probe card assembly. For example, low voltage swing signals used on a DUT can be amplified when passing from the DUT to a tester (or test circuitry on the probe card assembly), and high voltage swing signals used on the probe card assembly can be attenuated when passing from the (or test circuitry on the probe card assembly) to the DUT. For example, the slew rate converters can also include amplifiers and attenuators to adjust voltage levels of signals passing through the slew rate converters. This can help to increase noise immunity on the probe card assembly, again allowing lower cost circuit board layout techniques to be used. As a specific example, voltage differences used by the DUT may be only a few tenths of a volt different between logic zero and logic one. This small voltage difference can be converted to voltage differences of several volts on the probe card assembly.

Layout of the probe card assembly can also be simplified by providing power converters on the probe card assembly. For example, many DUTs use multiple supply voltages, which can be different that supply voltages used on the probe card assembly to power the test devices. Including distributed power conversion within the probe card assembly can allow for a reduced number of power planes can be used in the probe card assembly.

Figure 5:
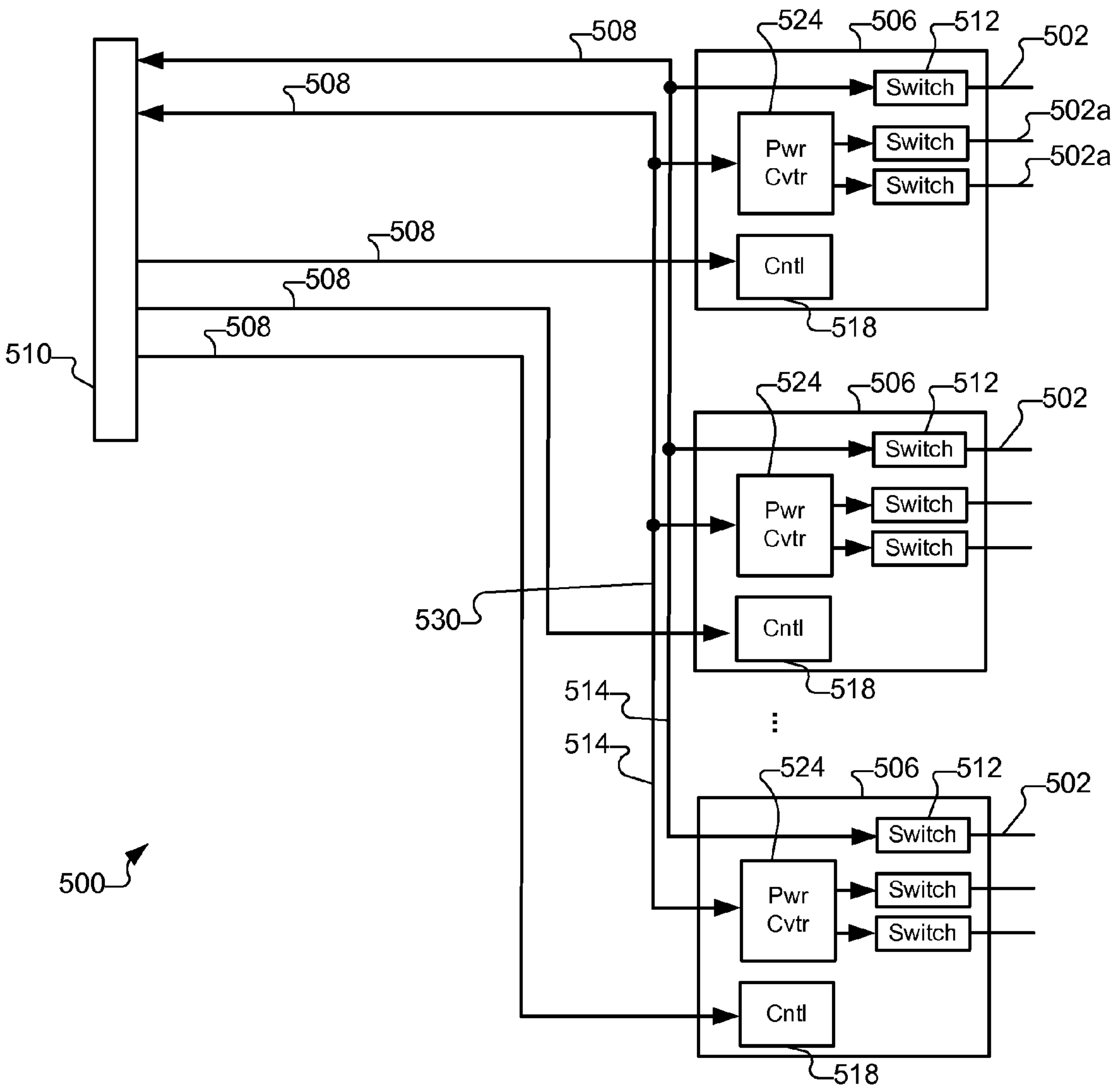
FIG. 5 is an electrical schematic of alternate arrangement of probe card assembly according to some embodiments of the invention.

For example, FIG. 5 is a schematic diagram of a probe card assembly 500 in accordance with some embodiments of the present invention that includes power converters 524 in test devices 506. The probe card assembly 500 can include features generally similar to probe card assemblies 200, 300, 400 (e.g., probes 502, electrical interconnections 508, electrical interface 510, switches 512, busses 514, and control circuit 518 can be similar to probes 202, 302, 402 electrical interconnections 208, 308, 408 electrical interface 210, 310, 410 switches 212, 312, 412 busses 214, 314, 414, and control circuit 218, 318, 418). The probe card assembly 500 can be mechanically arranged similarly to probe card assemblies 200, 300, 400 (e.g., probe card assembly 500 can include one or more substrates on which components such as probes 502, test devices 506, electrical interface 510, etc. are disposed). The probe card assembly 500 can also include any combination of features such as a memory 216, overcurrent detectors 320, continuity detectors 322, and slew rate coverers 424 as described above. The probe card assembly 500 can, if desired, include a memory (e.g., like memory 216 described above) for storing a map of failed devices and fault information.

Power converters 524 can accept a power input 530 and provide both internal power for the test devices 506 as well as provide power outputs to probes 502*a* corresponding to power terminals for powering the DUTs. As described above, switches 512 can provide for disconnection of the probes 502 from the power converter 524 (for example, when a failed DUT is detected). The power converters 524 can, if desired, include any of voltage conversion, voltage regulation, remote sensing, and overcurrent detection/protection. If desired, voltage/current ramping up and down can also be provided in the power converters 524. Operation of the power converters can controlled by the control circuit 518.

The power input 530 to the power converters 524 can be provided by various sources. For example, the power input can be unregulated bulk power provided by a tester or test station in which the probe card assembly 500 is used. As another example, the power input 530 can be provided by an external power supply that is interfaced to the probe card assembly. As yet another example, the power input can be output signals from a tester that are programmed for a predefined output voltage.

Various techniques can be used in the power converters 524 to convert the power input 530 to voltages/currents used by the DUTs. For example, the power converters 524 can include programmable power supplies that are controlled by the control circuit 518. As another example, the power converters 524 can include high efficiency DC-DC converters Using the power converter 524 to generate power supplied to the semiconductor devices on the wafer signals can help to simplify the layout of the probe card assembly. For example, a single power plane can be used to distribute power throughout a printed circuit board of the probe card assembly. The power can be converted by the test devices 506 to multiple voltages/currents actually used by the test devices and the DUTS.

While various features, such as memory, overcurrent detection, continuity detection, slew rate conversion, and power conversion, have been illustrated above in various embodiments in FIGS. 2-5, it is to be appreciated that a probe card assembly can include other combinations of the above features. As mentioned above, a probe card assembly in any of FIGS. 2-5 can include one or more features from other ones of the figures. In other words, embodiments of a probe card assembly can include combinations of any one or more of the features illustrated in FIGS. 2-5.

As discussed above, the inclusion of switches on the probe card assembly allows defective DUTs to be disconnected. This allows bussed signal connections to be used, greatly reducing the number of interconnections on the probe card assembly. This in turn allows for much less expensive components (e.g., connectors, printed circuit boards, etc.) to be used for the probe card assembly.

Figure 6:
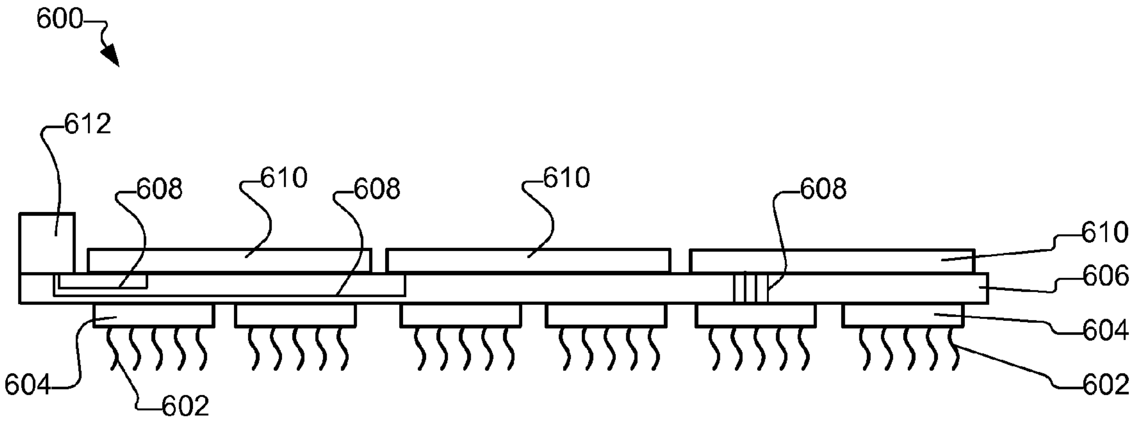
FIG. 6 an illustration of a probe card assembly according to some embodiments of the invention.

For example, FIG. 6 provides a side view illustration of a probe card assembly in accordance with some embodiments of the present invention. The probe card assembly 600 comprises a plurality of probe substrates 604 on which a plurality of probes 602 are disposed. The probes are arranged to contact terminals of semiconductor devices on a wafer, for example as described above for FIG. 1. The probe substrates 604 can be mechanically and electrically coupled to a circuit board 606. For example, the probe substrates 604 can be mounted in an adjustable orientation relative to the circuit board 606 and/or each other.

Disposed on the circuit board can be test devices 610. The test devices can include active electronic circuitry, for example, switches, overcurrent detectors, continuity detectors, slew rate converters, and power converters. Various examples of active electronic circuitry that can be included in a test device are illustrated in FIGS. 2-5 and described above. The test devices 610 can provide for connection between the probes 602 and interconnections 608. For example, the interconnections 608 can include electrical busses as described above. The interconnections 608 can be disposed on surfaces or interior layers of the circuit board (e.g., interconnections can comprises printed circuit board traces and vias).

A connector 612 can also be disposed on the circuit board 606. The connector can provide for an electrical interface between the test devices 610 and an external device (e.g., a tester), for example, as described above. By using bussed connections, the number of interconnections 608 brought to the connector 612 can be reduced, helping to reduce cost of the probe card assembly.

Various arrangements of the test devices 610 on the probe card assembly 600 can be used. For example, each test device can correspond to a single semiconductor device on the wafer to be tested (e.g., as illustrated above in FIGS. 2-5). For example, for a semiconductor device having twenty input/output terminals, the test device can include twenty switches allowing each of twenty probes corresponding to the twenty input/output terminals to be alternatively connected or disconnected. As another example, a semiconductor device can have many terminals corresponding to the same function (e.g., multiple power and ground pins). In such a case, probes corresponding to the same function can be connected together on the probe card assembly and connected to a single common switch. Thus, the number of switches can be less than the number of probes.

Alternatively, each test device 610 can accommodate multiple semiconductor devices on a wafer to be tested. For example, a test device 610 can include sufficient switches and other circuitry to connect to probes corresponding to two, four, or some other number of semiconductor devices on the wafer to be tested.

Although the test devices 610 are shown disposed on the top of circuit board 206 (the side opposite the probe substrates 604 and probes 602), this is not essential. For example, the test devices 610 can alternatively be disposed on the probe substrate 604, or disposed on another substrate (e.g., a daughter card) which is connected to the circuit board 606.

Figure 7:
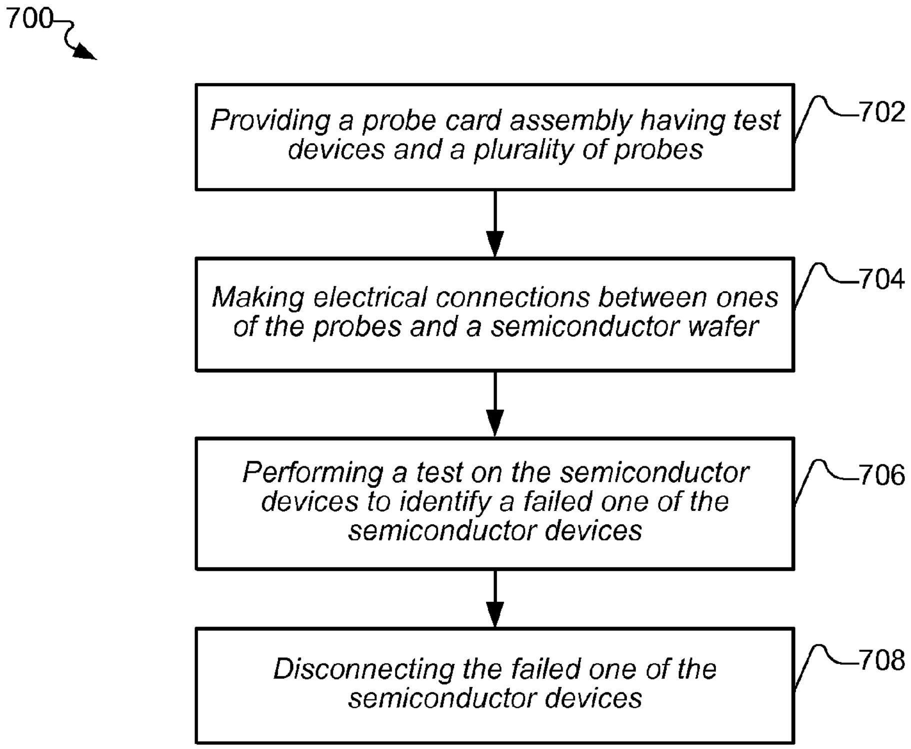
FIG. 7 is a flow chart of a process for using a probe card assembly according to some embodiments of the invention.

A process for using a probe card assembly (e.g., any of probe card assemblies and variations thereof described above in FIGS. 1-6) is illustrated in flow chart form in FIG. 7. The process, shown generally at 700, can include obtaining a probe card assembly having test devices and a plurality of probes 702. The probes can be electrically connected via switches disposed in the test devices to internal connections of the probe card assembly. One or more of the internal connections can be electrical busses. The test devices can also include any of overcurrent detectors, continuity detectors, slew rate converters, and power converters, for example as described above.

The process 700 can also include making electrical connections between ones of the probes and a semiconductor wafer 702. For example, the wafer can be brought into physical contact with the probes of the probe card assembly. The wafer can include a plurality of semiconductor devices disposed on the wafer. The electrical connections can thus be made between the probes and corresponding terminals of the semiconductor devices. Not all of the probes will always initially make contact with corresponding terminals, for example, due to misalignment, as mentioned above. In such a case, continuity tests can be performed, and adjustment of the semiconductor wafer relative to the probe card assembly made, for example as described above.

Another operation in the process 700 can be performing a test on the semiconductor devices to identify a failed one of the semiconductor devices 706. Various tests can be performed. For example, tests can include continuity tests, overcurrent sensing, functional tests, burn-in tests, and the like. If desired, as described above, adjustment of the relative position of the wafer and the probe card assembly can be made based on the results of continuity tests.

The process 700 can also include disconnecting the failed one of the semiconductor devices. For example, switches included in test devices on the probe card assembly can be opened to disconnect probes corresponding to terminals of the failed semiconductor device. Switches can be opened to disconnect all of the terminals of the failed semiconductor device, even though a failure is only detected on one terminal of the semiconductor device.

As an alternative to performing a test to identify a failed one of the semiconductor devices 706, a map of known failed ones of the plurality of semiconductor devices can be provided to the probe card assembly. Using the map of known failed ones of the semiconductor devices, switches can be opened to disconnect the bad devices.

Although specific embodiments and applications of the invention have been described in this specification, these embodiments and applications are exemplary only, and many variations are possible. Accordingly, there is no intention that the invention be limited these exemplary embodiments and applications or to the manner in which the exemplary embodiments and applications operate or are described herein. For example, features shown in one embodiment can be combined with features shown in another embodiment. Accordingly, it is not intended that the invention be limited except as by the claims set forth below.

We claim:

1. A probe card assembly for testing semiconductor dies, the probe card assembly comprising:

a rigid substrate;

an electrical interface to a tester;

sets of probes disposed on the substrate, each said set of probes comprising multiple probes arranged to contact multiple terminals of one of the semiconductor dies, wherein each set of probes is arranged to contact the terminals of a different one of the semiconductor dies;

a plurality of switches interconnecting ones of the probes to electrical interconnections to the electrical interface;

an overcurrent detector means for detecting excessive current at one of the terminals of a failed one of the semiconductor dies; and a means for controlling, in response to the overcurrent detector means detecting the excessive current at the one of the terminals of the failed one of the semiconductor dies, the switches to disconnect all of the multiple probes in the set of probes corresponding to the terminals of the failed one of the semiconductor dies.

2. The probe card assembly of claim 1, further comprising means for accepting a map of known failed ones of the plurality of semiconductor dies via the electrical interface, wherein the means for controlling the switches further disconnects all of the probes corresponding to the terminals of the known failed ones of the plurality of semiconductor dies from the electrical interconnections.

3. The probe card assembly of claim 1, further comprising means for performing a continuity check of electrical paths between the electrical interface and the probes.

4. The probe card assembly of claim 1, further comprising a memory configured to store fault information identifying the failed one of the plurality of semiconductor devices.

5. The probe card assembly of claim 1, further comprising a communication interface configured to communicate fault information between the probe card assembly and a tester, the fault information comprising identification of the failed one of the plurality of semiconductor devices.

6. The probe card assembly of claim 1, wherein the electrical interconnections comprise a power bus and a signal bus.

7. The probe card assembly of claim 1, further comprising a power converter configured to perform a power conversion between an input power provided to the probe card assembly and power supplied to the semiconductor dies.

8. The probe card assembly of claim 1, wherein the switches are selected from the group consisting of: an electromechanical relay, a transistor, a thyristor, and a photo coupled field effect transistor.

9. A probe card assembly for testing a plurality of semiconductor devices disposed on a wafer wherein each semiconductor device comprises a plurality of input/output terminals, the probe card assembly comprising:

a rigid substrate;

an electrical interface;

a plurality of probes disposed on the substrate and arranged to contact ones of the input/output terminals;

a plurality of switches interconnecting ones of the probes to electrical interconnections, wherein the electrical interconnections comprise an electrical bus; and a means for controlling the switches to enable each of the probes corresponding to the input/output terminals of a failed one of the plurality of semiconductor devices to be disconnected from the electrical interconnections, wherein the electrical interconnections are electrically connected to the electrical interface and comprise:

a first electrical bus interconnected to first ones of the input/output terminals of the semiconductor devices through a plurality of first switches of the plurality of switches; and a second electrical bus interconnected to second ones of the input/output terminals of the semiconductor devices to through a plurality of second switches of the plurality of switches, wherein ones of the second switches corresponding to the failed one of the plurality of semiconductor devices are opened to disconnect the failed one of the plurality of semiconductor devices from the second electrical bus when a failure of the failed one of the plurality of semiconductor devices is detected on the first electrical bus.

10. The probe card assembly of claim 9, further comprising means for accepting a map of known bad ones of the plurality of semiconductor devices on the wafer via the electrical interface.

11. The probe card assembly of claim 9, further comprising means for performing a continuity check.

12. The probe card assembly of claim 9, further comprising an overcurrent detector for determining a failed one of the plurality of semiconductor devices.

13. The probe card assembly of claim 9, further comprising a memory configured to store fault information identifying the failed one of the plurality of semiconductor devices.

14. The probe card assembly of claim 9, further comprising a communication interface configured to communicate fault information between the probe card assembly and a tester, the fault information comprising identification of the failed one of the plurality of semiconductor devices.

15. The probe card assembly of claim 9, wherein the electrical interconnections comprise a power bus and a signal bus.

16. The probe card assembly of claim 9, further comprising a power converter configured to perform a power conversion between an input power provided to the probe card assembly and power supplied to the semiconductor devices.

17. The probe card assembly of claim 9, wherein the switches are selected from the group consisting of: an electromechanical relay, a transistor, a thyristor, and a photo coupled field effect transistor.

18. A probe card assembly for testing semiconductor dies of a semiconductor wafer having a plurality of terminals disposed thereon, the probe card assembly comprising:

a rigid substrate;

an electrical interface to a tester for controlling testing of the semiconductor dies;

a plurality of probes disposed on the substrate and arranged to contact corresponding ones of the plurality of terminals of the semiconductor dies;

a continuity tester means for testing an electrical path between the electrical interface to the tester and one of the probes for a short circuit fault and an open circuit fault in the electrical path; and a plurality of switches interconnecting the plurality of probes to the continuity tester means, the switches enabling the continuity tester means to be electrically connected to a selected one of the plurality of probes;

wherein the continuity tester means is for testing the electrical path between the electrical interface to the tester and one of the probes for the short circuit fault and the open circuit fault while the probes are disconnected from the terminals of the semiconductor dies.

19. The probe card assembly of claim 18, further comprising means for performing a self test of the probe card assembly using the continuity tester means.

20. The probe card assembly of claim 18, wherein the switches are selected from the group consisting of: an electromechanical relay, a transistor, a thyristor, and a photo coupled field effect transistor.

* * * * *